United States Patent
Schupbach

(10) Patent No.: US 9,225,350 B1
(45) Date of Patent: Dec. 29, 2015

(54) LOW NOISE FREQUENCY SOURCE

(75) Inventor: Steven Schupbach, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 259 days.

(21) Appl. No.: 11/291,856

(22) Filed: Nov. 30, 2005

(51) Int. Cl.
*H03L 7/06* (2006.01)
*H03L 7/23* (2006.01)

(52) U.S. Cl.
CPC . *H03L 7/235* (2013.01); *H03L 7/06* (2013.01)

(58) Field of Classification Search
CPC ........... H03L 7/06; H03L 7/093; H03L 7/143; H03L 7/235
USPC .................. 331/1 A, 2, 18, 16; 327/147, 156; 375/376, 373
See application file for complete search history.

(56) References Cited

U.S. PATENT DOCUMENTS

| | | | | |
|---|---|---|---|---|
| 4,965,533 A | * | 10/1990 | Gilmore | 331/18 |
| 5,028,887 A | * | 7/1991 | Gilmore | 331/18 |
| 5,184,093 A | * | 2/1993 | Itoh et al. | 331/25 |
| 5,654,657 A | * | 8/1997 | Pearce | 327/163 |
| 5,757,239 A | * | 5/1998 | Gilmore | 331/18 |
| 5,859,570 A | * | 1/1999 | Itoh et al. | 331/18 |
| 5,963,607 A | * | 10/1999 | Romano et al. | 375/373 |
| 5,995,812 A | * | 11/1999 | Soleimani et al. | 455/119 |
| 6,104,252 A | * | 8/2000 | Hofmann | 331/16 |
| 6,175,280 B1 | * | 1/2001 | Lloyd et al. | 331/1 R |
| 6,198,353 B1 | * | 3/2001 | Janesch et al. | 331/16 |
| 6,430,235 B1 | * | 8/2002 | O'Shea et al. | 375/326 |
| 2005/0003785 A1 | * | 1/2005 | Jackson et al. | 455/260 |

FOREIGN PATENT DOCUMENTS

JP    05-2436    *    1/1993    ............. H03B 28/00

* cited by examiner

*Primary Examiner* — Levi Gannon

(57) ABSTRACT

A frequency source for providing a desired source frequency has a direct digital synthesis circuit having a DDS output including a desired DDS frequency, a plurality of low-level spur frequencies and a plurality of high-level spur frequencies; a first clock input for the direct digital synthesis circuit; a second clock input for the direct digital synthesis circuit; a DDS filter in communication with the DDS output; and a controller. The controller selects one of the clock inputs to avoid having a high-level spur in an output of the DDS filter. The source frequency is provided at the DDS filter output.

4 Claims, 3 Drawing Sheets

LOW NOISE FREQUENCY SOURCE

BACKGROUND OF THE INVENTION

The present invention relates to frequency sources and, in particular, to sources utilizing a direct digital synthesis circuit.

Modern microwave frequency synthesizers in the general laboratory instrument class typically employ one of two architectures for achieving fine frequency resolution: fractional-N (Frac-N) or direct digital synthesis (DDS).

Referring to FIG. 1, a basic Frac-N synthesizer is shown. A reference frequency $f_{ref}$ is applied to a phase-locked loop (PLL) having a fractional-N frequency divider in the feedback path. In the PLL, the fractional-N frequency divider allows the reference frequency to be multiplied by a value N·f that may include, not only an integer, but also, a fractional portion. This fractional capability is implemented by quickly switching between integer divisor values, resulting in an "average" frequency equivalent to a fractional division. With careful attention to design, Frac-N microwave synthesizers have been shown to provide excellent performance in terms of low spurious and phase noise content. However, such devices tend to be expensive and/or proprietary.

DDS circuits, as the name implies, directly generate a frequency. At their heart is an accumulator that accumulates a digital increment that conceptually corresponds to a phase increment. This phase increment is continually added to the sum of the previous phase increments. This phase value is used to address a sine-value table. The sine-value is applied to a digital to analog converter, which ideally would produce a frequency output of the DDS that is a pure sinusoid.

Currently, DDS synthesizers suffer from two undesirable performance characteristics. DDS generates relatively high levels of spurious signals in addition to the single desired sinusoid and it is capable of achieving only a moderate level of phase noise performance. A straight-forward application of DDS in a general laboratory instrument synthesizer will result in uncompetitive performance. However, DDS synthesizers are readily available and relatively inexpensive. For example, the company Analog Devices produces and sells a 2.7 GHz DDS synthesizer integrated circuit, model AD9956, that offers a 48-bit tuning word providing very fine resolution frequency generation.

SUMMARY OF THE INVENTION

A frequency source for providing a desired source frequency has a direct digital synthesis circuit having a DDS output including a desired DDS frequency, a plurality of low-level spur frequencies and a plurality of high-level spur frequencies; a first clock input for the direct digital synthesis circuit; a second clock input for the direct digital synthesis circuit; a DDS filter in communication with the DDS output; and a controller. The controller selects one of the clock inputs to avoid having a high-level spur in an output of the DDS filter. The source frequency is provided at the DDS filter output.

DESCRIPTION OF THE PREFERRED EMBODIMENTS

Figure 1:
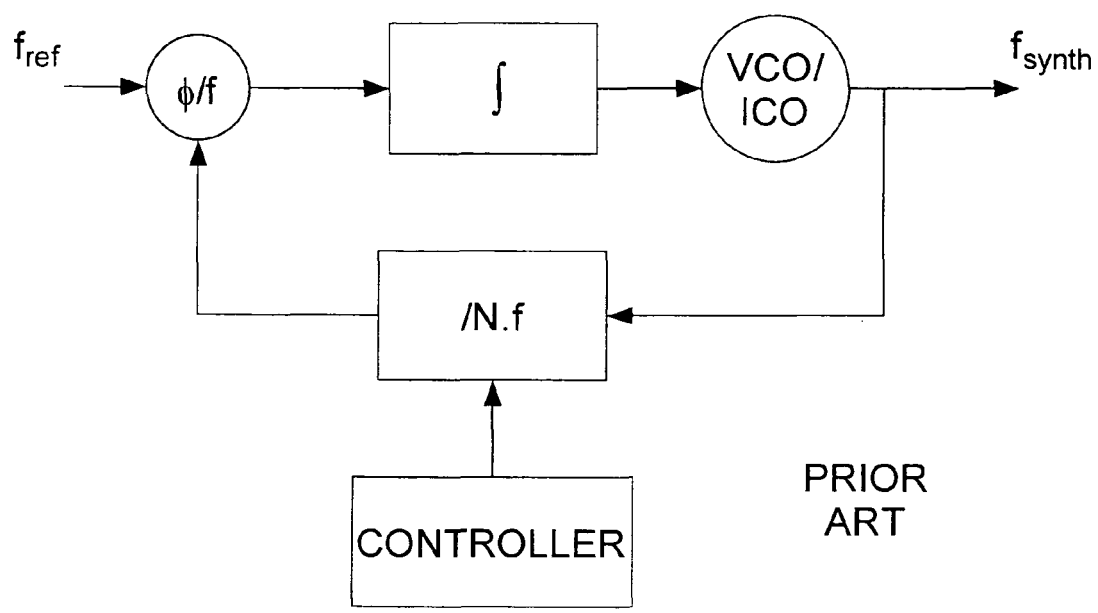
FIG. 1 is a schematic block diagram of a prior art N-Frac synthesizer.
Figure 2:
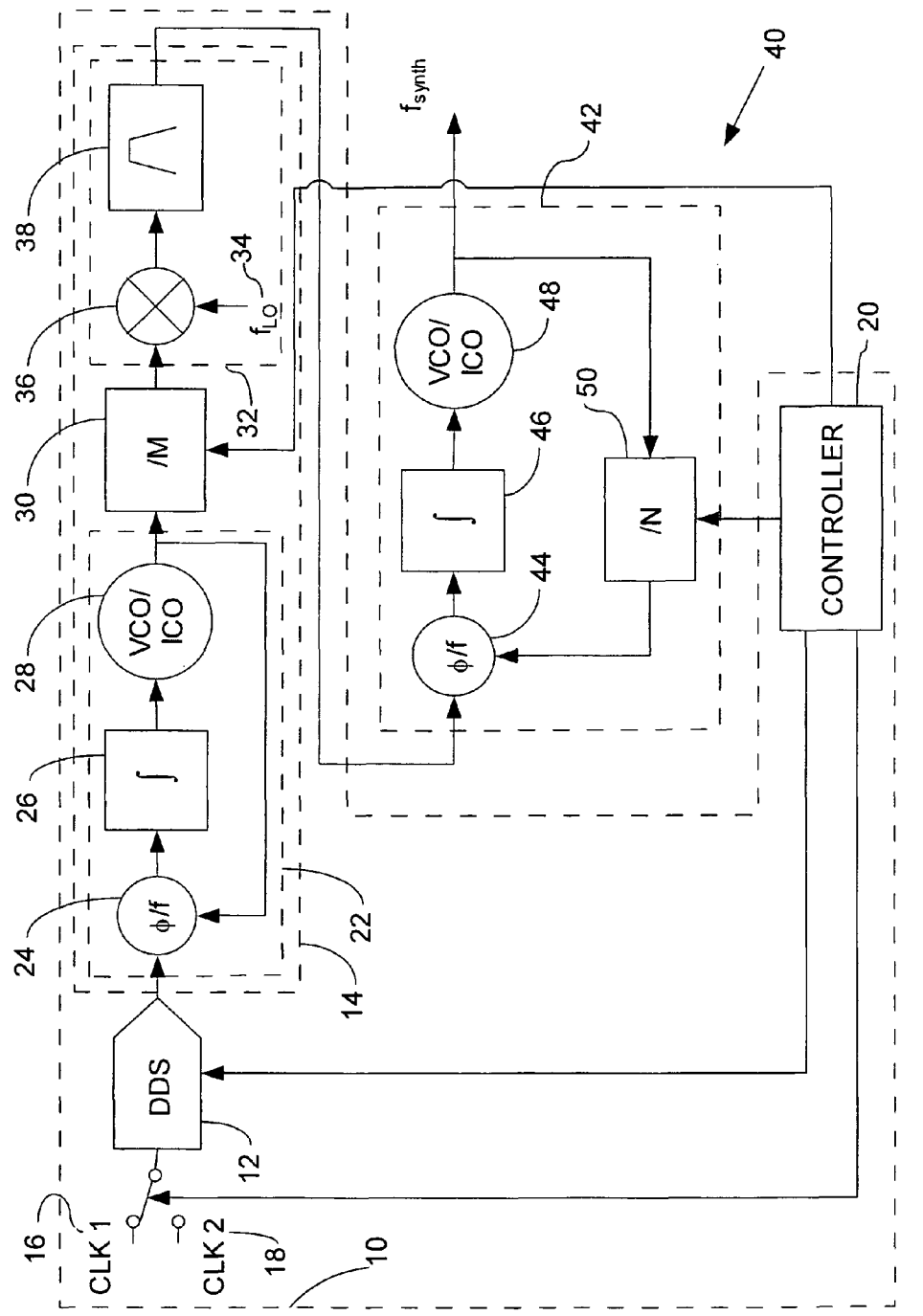
FIG. 2 is a schematic block diagram of a synthesizer using an example of a DDS frequency source according to the invention.

Referring to FIG. 2, a DDS frequency source 10 includes a DDS circuit 12 and a DDS filter 14. The DDS source 10 is provided with two clock inputs 16, 18, the operative clock input being selected by a controller 20.

The DDS circuit 12 is of a type well-known in the art. The DDS circuit directly generates a desired DDS frequency. The circuit 12 includes an accumulator that accumulates a digital increment that conceptually corresponds to a phase increment. The desired DDS frequency is selected by the combination of the operative clock input frequency and a frequency data word (FDW) supplied by the controller 20.

The DDS circuit 12 may be, for example, a model AD9956 integrated circuit (IC) manufactured by Analog Devices. This IC has a 48-bit FDW (i.e., a FDW between 0 and $2^{48}-1$, inclusive). The desired DDS frequency is equal to the product of the operative clock input frequency, the FDW and $2^{-48}$.

Unfortunately, the DDS circuit 12 has an output that typically includes not only the desired DDS frequency, but also spurious signals of two distinct types. First are many low-level spurs resulting from the limited resolution and non-linearity of the digital to analog converter found in the DDS circuit 12 and from the truncation of phase word by the accumulator. These low-level spurs may be, for example, −75 dBc and are distributed more-or-less uniformly over the output spectrum of the DDS circuit 12. Second are several high-level spurs resulting from the inherent sampling action of the digital to analog converter in the DDS circuit 12. These high-level spurs may be, for example, −55 dBc and sweep through the DDS output spectrum moving both up and down at various rates as the desired DDS frequency is varied. They intersect the vicinity of the DDS frequency at predictable points. The ratio of the frequency of these points to the clock frequency is fixed.

The DSS filter 14 reduces one or more of these types of spurious signals. This allows the frequency source 10 to be used in applications requiring clean signals heretofore unavailable using DSS techniques.

To remove the high-level spurs that are not in the vicinity of the desired DDS frequency, a frequency tracking bandpass filter 22 is used in the DSS filter 14. The filter 22 tracks the DDS frequency and has a bandwidth which is less than the spacing between the high-level spurs (e.g., one fifth the spacing). For example, the filter 22 may be a PLL that includes a frequency/phase detector 24, an integrator 26 and a voltage or current controlled oscillator 28. The filter 22 attenuates the high-level spurs that are outside its bandwidth. Other types of phase detectors may also be employed in the PLL.

The bandwidth of the filter 22 should be as narrow as possible. In this way it provides the maximum suppression of DDS spurs over the largest possible range of DDS frequencies for a given DDS clock frequency. But, the passband should be wide enough to satisfy two other PLL performance constraints:

The time required for frequency switching of a PLL is roughly inversely proportional to the PLL bandwidth. For example, a PLL bandwidth of 100 Hz might be desirable for DDS spur suppression. This would, for example, result in a switching speed of about 0.5 second, but in many applications, this is too slow. For example, a speed of 0.0015 second may be desirable.

In many designs, the PLL bandwidth is set such that the PLL output phase noise distribution about the carrier is essentially set by the input reference frequency phase noise (near the carrier) and by the VCO/ICO phase noise (far from the carrier). If this methodology is not followed, the resulting phase noise distribution about the output carrier of the PLL can be unacceptable for many applications, especially for inappropriately narrow bandwidths.

With these factors considered, the bandwidth used may be, for example, about 200 KHz. This bandwidth, for example, gives a frequency switching speed of about 0.00025 second and still results in PLL bandwidth narrow enough to result in DDS spur rejection over a large DDS frequency range.

The tracking bandpass filter may be implemented in other ways. For example, an electronically-tuned bandpass filter, multiple switched fixed bandpass filters covering different portions of the total frequency range, or a combination of lowpass, and/or highpass, and/or band-reject filters, either a single set or multiple switched sets.

With a single clock input to the DDS 12, some high-level spurs may, unfortunately, end up in the passband of the filter 22. However, because the locations of the high-level spurs are a known function of the input clock (and the DSS frequency), if a high-level spur for a given DSS frequency will be located within the bandpass of the filter 22, a different clock is selected by the controller 20 such that no high-level spur is within the bandpass of the filter 22 (and of course a different FDW is also selected to keep the DSS frequency the same). Typically, only two clock frequencies may be needed, but more may be used.

To minimize the effect of the low-level spurs, the filter 14 may be provided with a frequency divider 30 that divides the DSS output frequency spectrum by an integer M. This division reduces the level of spurious signals and phase noise relative to the desired signal. Theoretically, this reduction in dB is =20*log M. For M=10 the spurious reduction is 20.0 dB. Thus, for −75 dBc low-level spurs at the DDS output, the remaining spurs are reduced to a level of less than −95 dBc. If the DDS phase noise level at an offset of 20 kHz is −130 dBc/Hz, the resulting phase noise level=−150 dBc/Hz.

The use of the divider 30 may result in an output frequency that is too low for use. To restore the usefulness, the signal may be translated to a higher frequency using a heterodyning circuit 32 in the filter 14. The heterodyning circuit 32 may, for example, include a local oscillator 34, a mixer 36 and a single-sideband filter 38. If the local oscillator 34 is chosen to have comparatively negligible phase noise and spurious signal levels, the resulting signal is at the frequency of the local oscillator plus or minus the divided signal frequency and the resulting signal has the same spurious and phase noise as prior to the heterodyning circuit 32.

The DDS frequency source 10 is useful in a frequency synthesizer 40 for providing a desired synthesized frequency. The DDS frequency source 10 is used as a reference frequency for a PLL 42. The PLL 42 may include, for example, a frequency/phase detector 44, an integrator 46 and a voltage or current controlled oscillator 48 with an integer divider 50 feedback path (it is of course possible to use a Frac-N divider instead). If the divisor is N, then the output of the PLL 42 (i.e., the desired synthesized frequency) is the frequency of the DSS frequency source output times N. In effect, the value of N provides a coarse adjustment of output frequency and the DDS frequency provides a fine adjustment. In this way, performance comparable to a high quality Frac-N synthesizer is achieved. In addition, avoiding a Frac-N divider may allow the use of a higher reference frequency for the PLL 42, which has additional phase noise advantages.

A low microwave frequency synthesizer (less than 3 GHz) will typically have a frequency output selectable in increments between 0.1 and 0.001 Hz.

Figure 3:
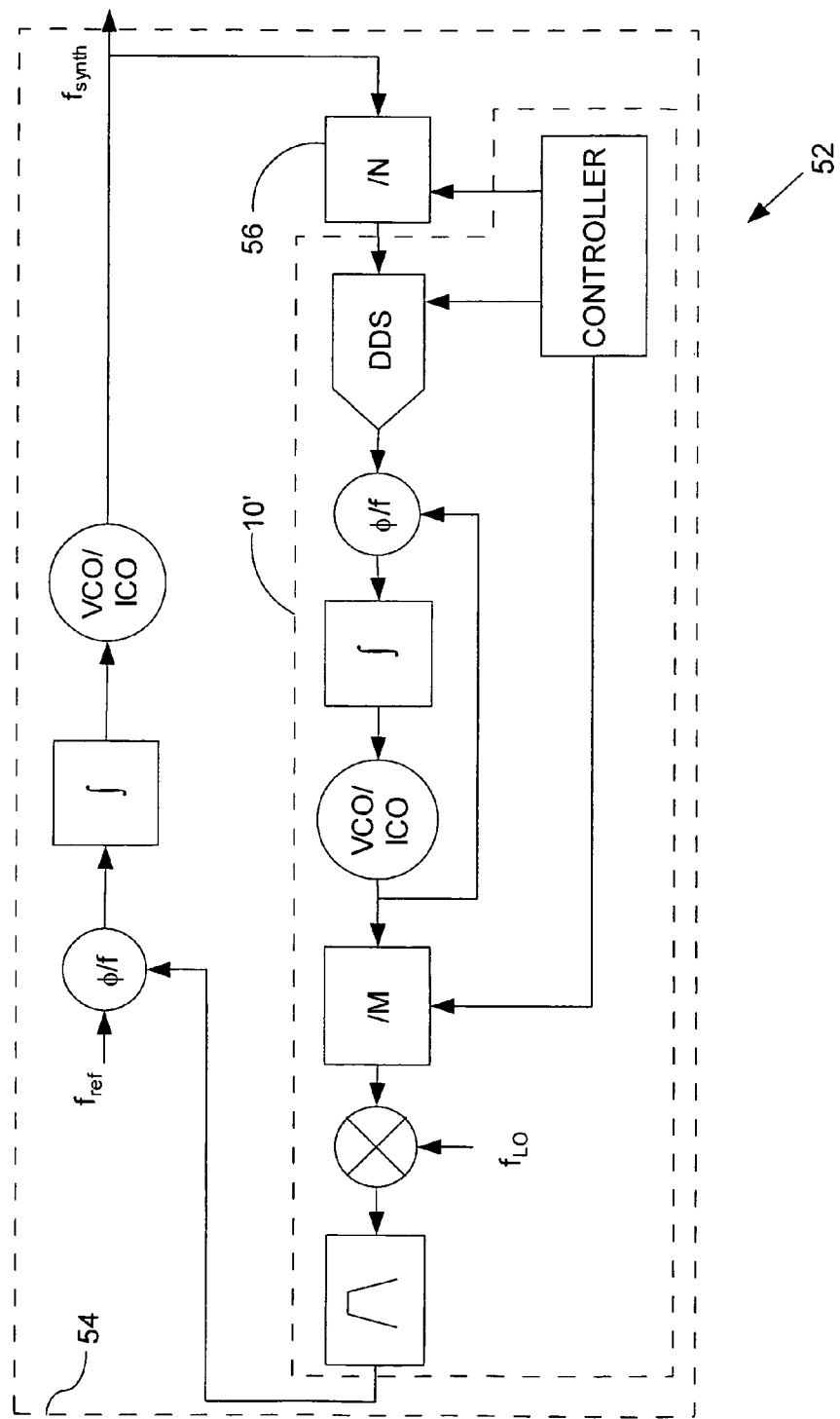
FIG. 3 is a schematic block diagram of another synthesizer using an example of a DDS frequency source according to the invention.

Referring to FIG. 3, a DSS frequency source 10' is useful in a frequency synthesizer 52 for providing a desired synthesized frequency. The DSS frequency source 10' is used in the feedback path of the PLL 54 to fine-tune the feedback frequency division. The integer divider 56 now performs three functions compared to the embodiment of FIG. 2. As before, it provides a coarse adjustment of the synthesizer, but it is also used to provide alternative clocks to the DSS frequency source 10' to ensure the elimination of high-level spurs from the output of the DSS frequency source 10'. In addition, it may also be used to reduce $f_{synth}$ to a frequency that is compatible to the DDS circuit clock input.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A frequency synthesizer for providing an output at a desired synthesized frequency, said synthesizer having a phase-locked loop that includes a feedback path, said feedback path comprising:
   an integer frequency divider that generates an output signal having a frequency that is a factor of an integer less than a frequency of an input signal to said integer divider; and
   a frequency source including:
   a direct digital synthesis circuit having a DDS output including said desired output, a plurality of low-level spur outputs at low-level spur frequencies and a plurality of high-level spur outputs at high-level spur frequencies, said high-level spur frequencies being a function of an input clock frequency utilized by said direct digital synthesis circuit, and occurring at a constant frequency spacing;
   a DDS filter in communication with said DDS output, said DDS output determining said desired synthesized frequency, said DDS filter being characterized by a passband that includes said desired source frequency; and
   a controller that selects said input clock frequency from a plurality of available clock frequencies such that one of said high-level spur outputs that is present within said passband at one of said available clock frequencies is not present at said selected clock frequency,
   wherein said controller selects said input clock frequency by setting said integer, and wherein said DDS filter includes a frequency tracking bandpass filter in communication with said DDS output, said bandpass filter having a central frequency and a bandwidth less than said spacing of said high-level spurs and being adapted to allow said central frequency to track said DDS output.

2. A frequency synthesizer according to claim 1, wherein said frequency tracking bandpass filter is a second phase-locked loop.

3. A frequency source for providing an output at a desired source frequency, said source comprising:
   a direct digital synthesis circuit having a DDS output including said desired output, a plurality of low-level spur outputs at low-level spur frequencies and a plurality of high-level spur outputs at high-level spur frequencies, said high-level spur frequencies being a function of an input clock frequency utilized by said direct digital synthesis circuit;

a DDS filter in communication with said DDS output, said DDS filter being characterized by a passband that includes said desired source frequency; and a controller that selects said input clock frequency from a plurality of available clock frequencies such that one of said high-level spur outputs that is present within said passband at one of said available clock frequencies is not present at said selected clock frequency, wherein said DDS filter includes a frequency tracking bandpass filter in communication with said DDS output, said bandpass filter having a bandwidth less than the spacing of said high-level spurs and being adapted to track said DDS output.

4. A frequency source according to claim 3, wherein said frequency tracking bandpass filter is a phase-locked loop.

* * * * *